United States Patent
Chih

(10) Patent No.: US 7,038,947 B2
(45) Date of Patent: *May 2, 2006

(54) TWO-TRANSISTOR FLASH CELL FOR LARGE ENDURANCE APPLICATION

(75) Inventor: Yue-Der Chih, Hsin-Chu (TW)

(73) Assignee: Taiwan Semiconductor Manufacturing Co., Ltd., (TW)

(*) Notice: Subject to any disclaimer, the term of this patent is extended or adjusted under 35 U.S.C. 154(b) by 92 days.

This patent is subject to a terminal disclaimer.

(21) Appl. No.: 10/858,020

(22) Filed: Jun. 1, 2004

(65) Prior Publication Data

US 2005/0007824 A1    Jan. 13, 2005

Related U.S. Application Data

(63) Continuation-in-part of application No. 10/323,982, filed on Dec. 19, 2002, now Pat. No. 6,781,881.

(51) Int. Cl.
  *G11C 16/04* (2006.01)
(52) U.S. Cl. .................... 365/185.18; 365/185.01; 365/185.27
(58) Field of Classification Search .......... 365/185.18, 365/185.27, 185.29, 185.33, 185.01, 185.05, 365/185.1
See application file for complete search history.

(56) References Cited

U.S. PATENT DOCUMENTS

| | | | | |
|---|---|---|---|---|
| 4,403,307 A * | 9/1983 | Maeda | ............... | 365/185.1 |
| 5,329,487 A * | 7/1994 | Gupta et al. | ............ | 365/185.1 |
| 5,357,466 A * | 10/1994 | Hong | ............ | 365/185.3 |
| 6,166,938 A * | 12/2000 | Wong | ............ | 365/49 |
| 6,317,349 B1 * | 11/2001 | Wong | ............ | 365/49 |
| 6,565,736 B1 * | 5/2003 | Park et al. | ............ | 205/746 |
| 6,788,576 B1 * | 9/2004 | Roizin | ............ | 365/185.1 |

* cited by examiner

*Primary Examiner*—Gene N. Auduong
(74) *Attorney, Agent, or Firm*—Duane Morris LLP

(57) ABSTRACT

An nonvolatile memory device having improved endurance is comprised of an array of nonvolatile memory cells arranged in rows and columns. Each memory cell is composed of a program transistor and read transistor with a control gate connected to a word line, a source connected the source select line, and a floating gate onto which an electronic charge is placed representing a data bit stored within the nonvolatile memory device. The program transistor has a drain connected a first bit line and a read transistor has a drain connected to the second bit line. Each memory cell has a floating gate connector joining the floating gate of the read transistor to the floating gate of the read transistor. The nonvolatile memory device has a voltage controller that programs the each memory cell by programming the program transistor and reading the read transistor.

84 Claims, 11 Drawing Sheets

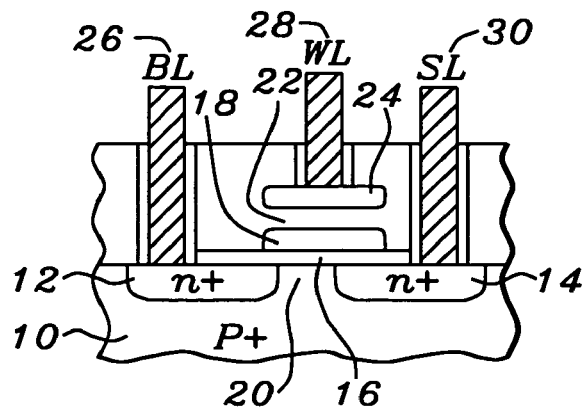
*FIG. 1a – Prior Art*
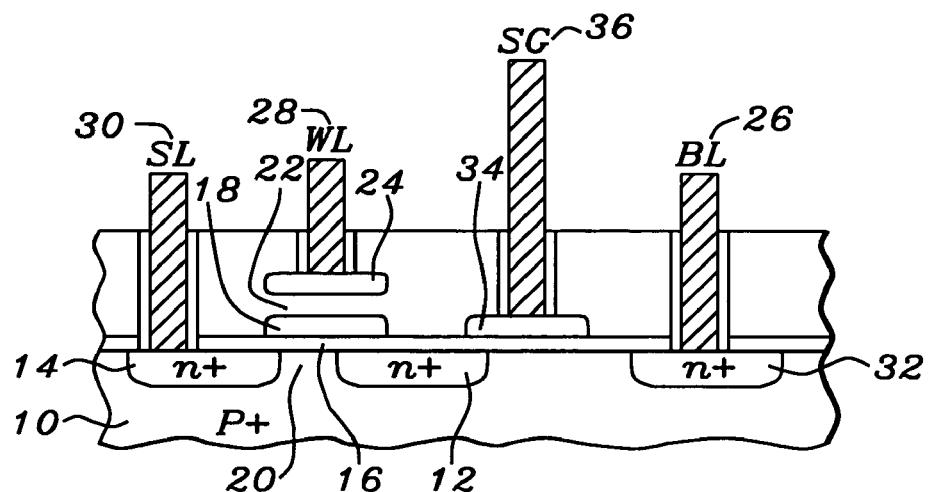
*FIG. 1b – Prior Art*
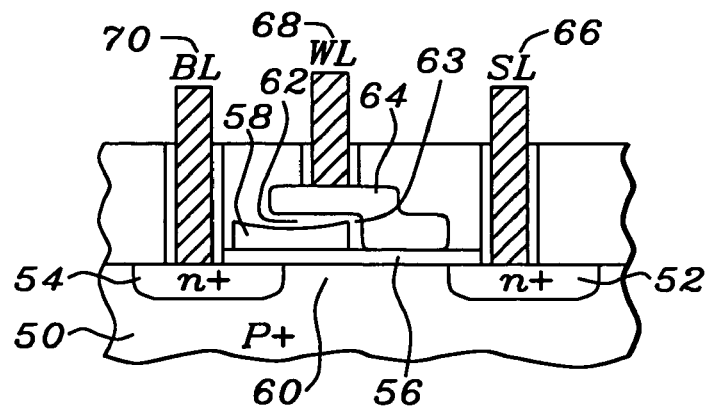
*FIG. 1c – Prior Art*

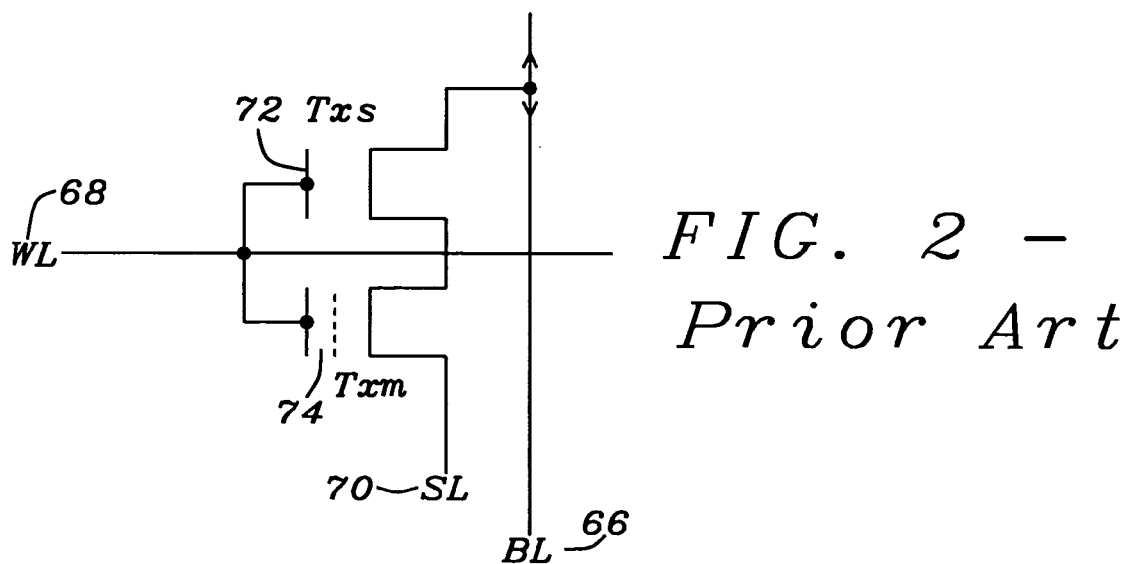
FIG. 2 – Prior Art
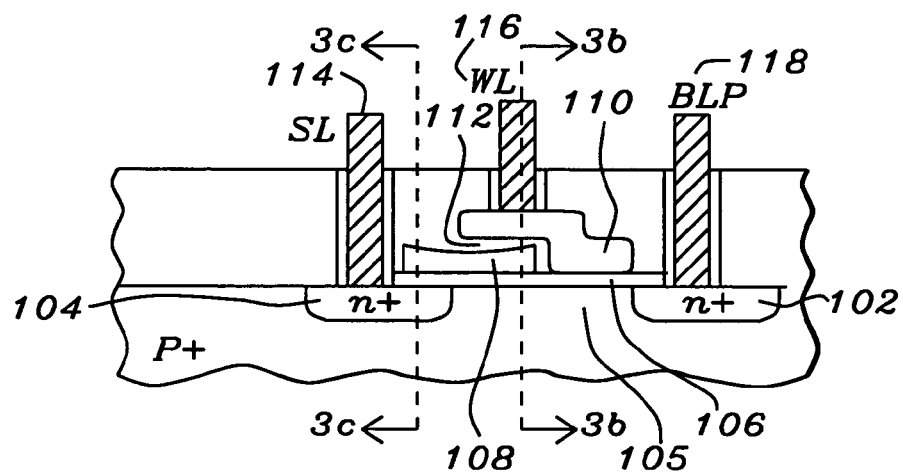
FIG. 3a
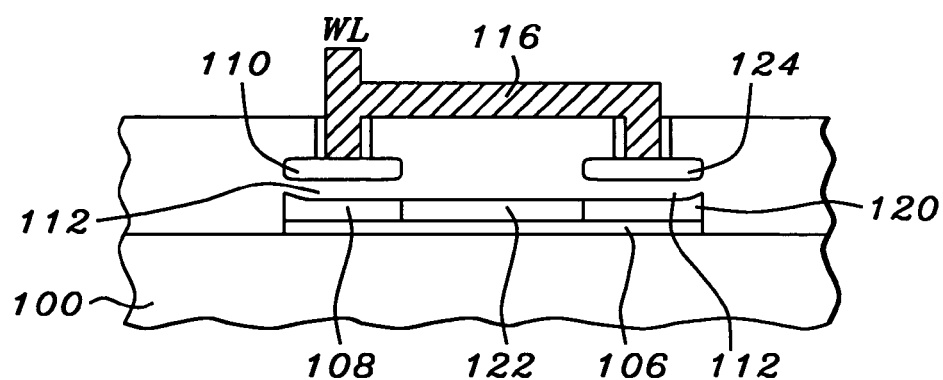
FIG. 3b

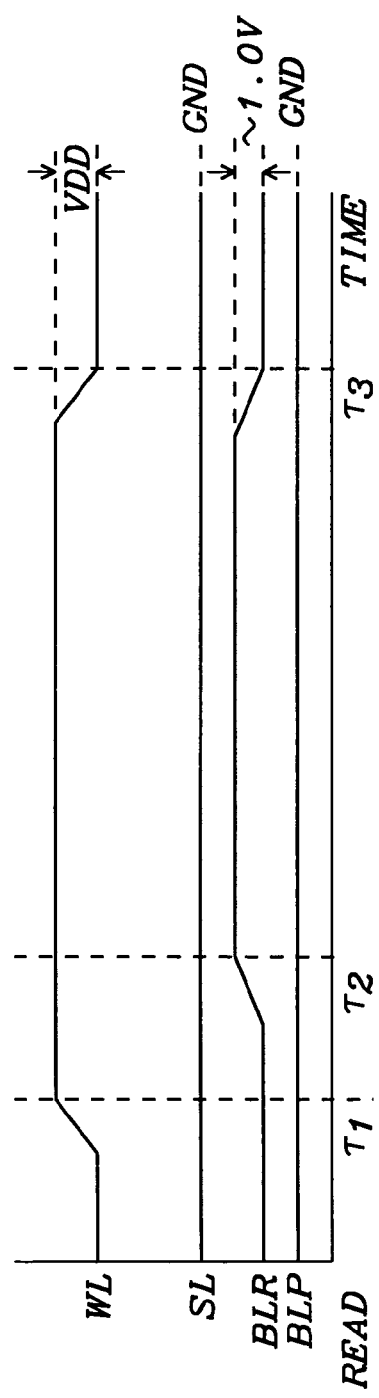
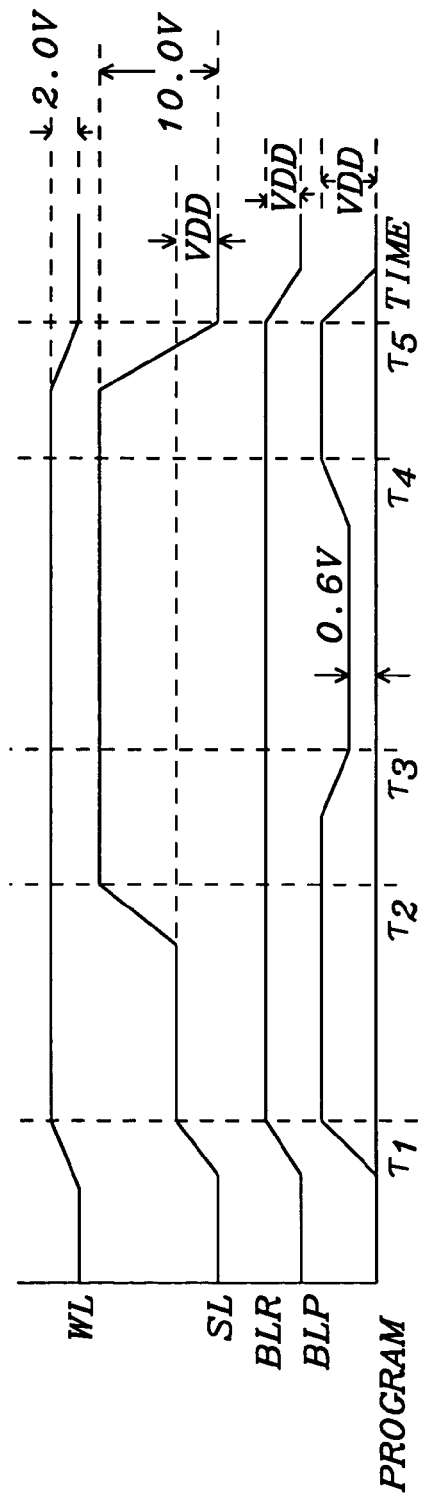
FIG. 5a
FIG. 5b

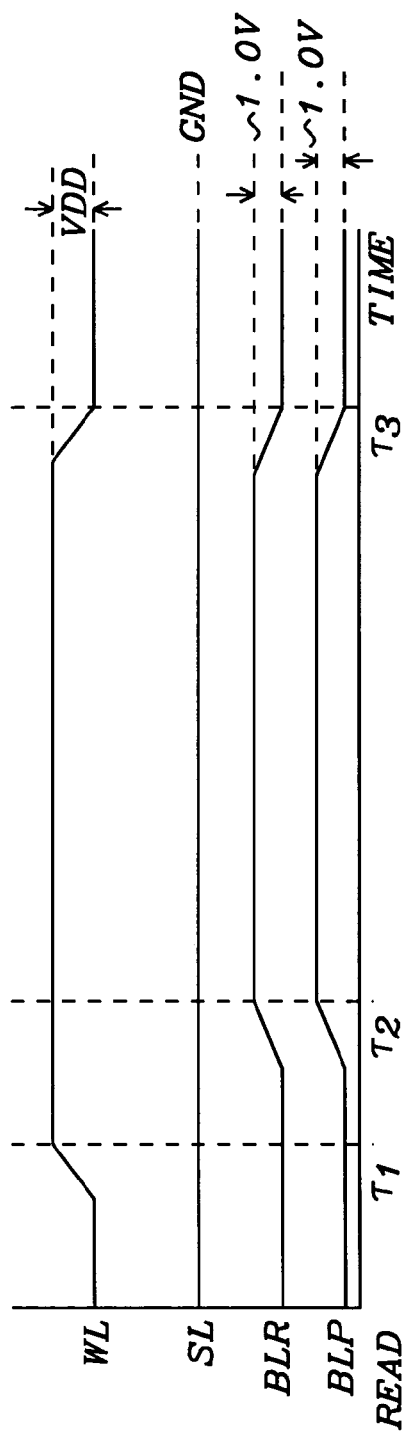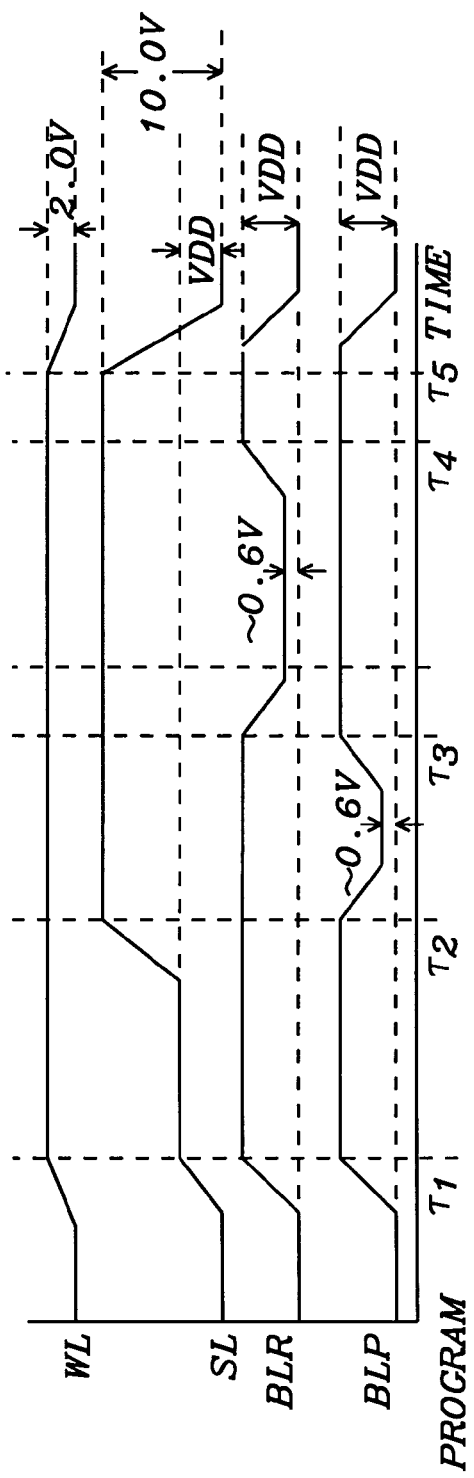

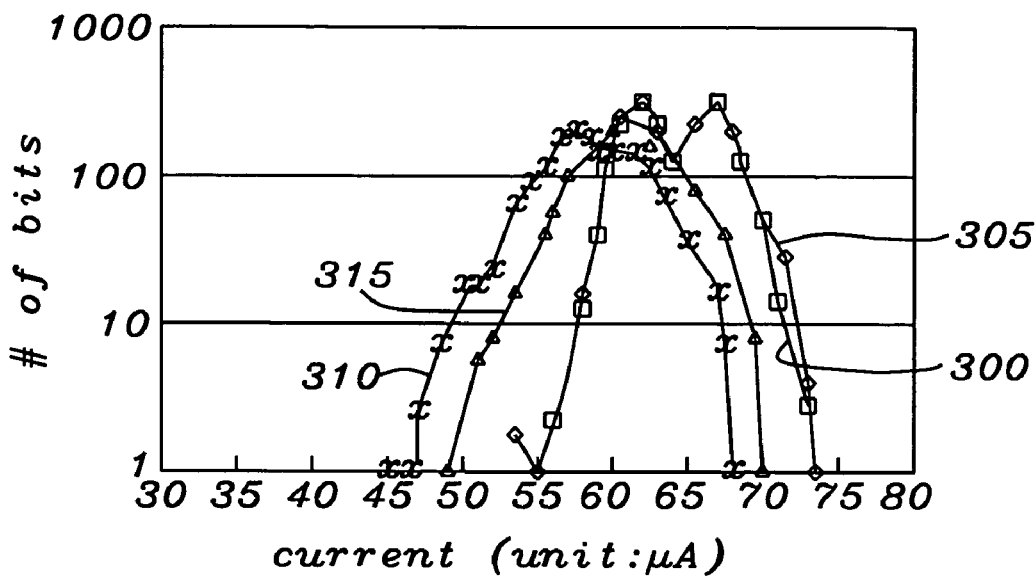
FIG. 7 - Prior Art
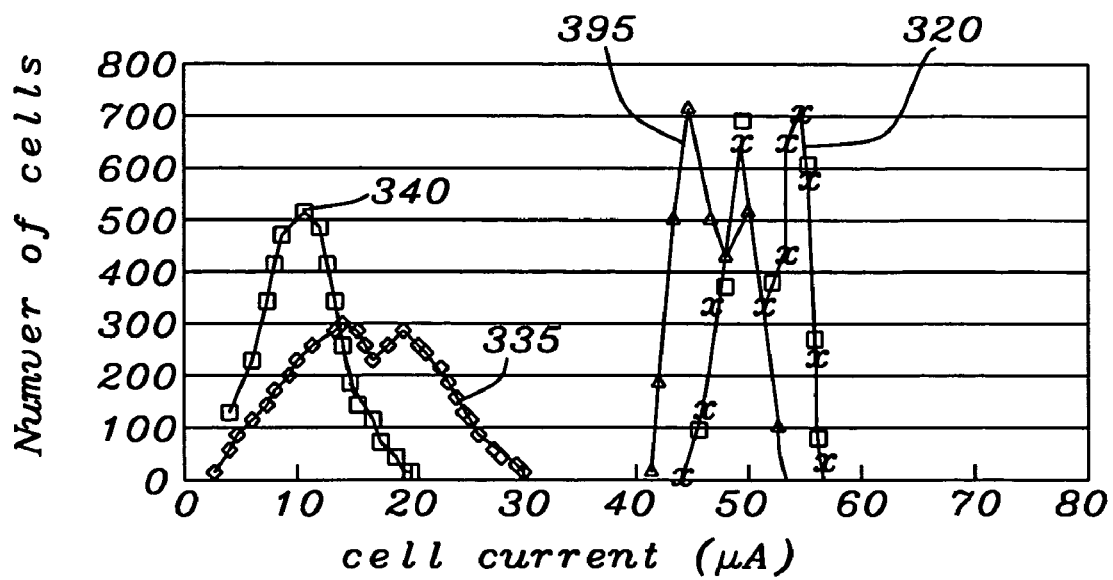
FIG. 8

TWO-TRANSISTOR FLASH CELL FOR LARGE ENDURANCE APPLICATION

This application is a Continuation-in-Part of U.S. patent application Ser. No. 10/323,982, filed Dec. 19, 2002 now U.S. Pat. No. 6,781,881, assigned to the same assignee as the instant application, and which is herein incorporated by reference in its entirety.

BACKGROUND OF THE INVENTION

1. Field of the Invention

This invention relates generally to a class of non-volatile memory devices referred to as flash electrically erasable programmable read-only memory (flash EEPROM). More particularly, this invention relates two-transistor flash EEPROM cells and arrays. Even more particularly this invention relates to methods and means to read, program, and erase digital data from a two-transistor flash EEPROM cell to improve endurance of the flash EEPROM cell.

2. Description of Related Art

The structure and application of the flash EEPROM is well known in the art and illustrated in "Technical Comparison of Floating Gate Reprogrammable Nonvolatile Memories," (SST White Paper) staff, Silicon Storage Technology, Inc., November, 2001 Technical Paper, found May 7, 2002 www.sst.com. The Flash EEPROM provides the density advantages of an erasable programmable read-only memory (EPROM) that employs ultra-violet light to eliminate the programming with the speed of a standard EEPROM. FIG. 1a illustrates a cross-sectional view of a stacked gate flash EEPROM cell of the prior art. The stacked gate flash EEPROM cell is formed within a p-type substrate 10. An n+ drain region 12 and an n+ source region 14 are formed within the p-type substrate 10.

A relatively thin gate dielectric 16 is deposited on the surface of the p-type substrate 10. The thin gate dielectric 16 is also referred to as a tunneling oxide. A poly-crystalline silicon floating gate 18 is formed on the surface of the gate dielectric 16 above the channel region 20 between the drain region 12 and source region 14. An interpoly dielectric layer 22 is placed on the floating gate 18 to separate the floating gate 18 from a second layer of poly-crystalline silicon that forms a control gate 24.

The source region 14 is connected to a source voltage generator through the source line 30. The control gate 28 is connected through the word line 28 to the word line voltage generator. And the drain region 12 is connected through the bit line 24 to the bit line voltage generator.

According to conventional operation, the flash EEPROM cell is programmed by setting the word line voltage generator to a relatively high voltage (on the order of 10V). The bit line voltage generator is set to a moderately high voltage (on the order of 5V), while the source line voltage generator is set to the ground reference potential (0V).

With the voltages as described above, hot electrons will be produced in the channel 20 near the drain region 12. These hot electrons will have sufficient energy to be accelerated across the gate dielectric 16 and trapped on the floating gate 18. The trapped hot electrons will cause the threshold voltage of the field effect transistor (FET) that is formed by the flash EEPROM cell to be increased by three to five volts. This change in threshold voltage by the trapped hot electrons causes the cell to be programmed.

To erase the flash EEPROM cell a moderately high positive voltage (on the order of 5V) is generated by the source line voltage generator. Concurrently, the word line voltage generator is set to a relatively large negative voltage (on the order of −10V). The substrate 10 is set to the ground reference potential. The bit line voltage generator is usually disconnected from the bit line 26 to allow the drain region 12 to float. Under these conditions there is a large electric field developed across the tunneling oxide 16 in the source region 14. This field causes the electrons trapped in the floating gate 18 to flow to portion of the floating gate 18 that overlaps the source region 16. The electrons are then extracted to the source region 14 by the Fowler-Nordheim tunneling.

The flash EEPROM functions based on the electronic charge stored on the floating gate 18 sets the memory transistor to a logical "1" or "0". Depending on whether the memory structure is an enhancement or depletion transistor when the floating gate is neutral or contains electrons (negative charge), the memory cell will or will not conduct during read. When the floating gate 18 is neutral or has an absence of negative charge, the memory cell will conduct during read. The conducting or nonconducting state is output as the appropriate logical level. In the memory cell as shown the word line voltage generator and the control gate 28 is set to the voltage level of the power supply voltage source. The substrate 10 and the source line voltage generator and thus the source 14 are set to the level of the ground reference voltage. The bit line voltage generator and the drain 12 are set to a small voltage level sufficient to cause a small current to conduct in the bit line 26. The small current is detected by a sense amplifier connected to the bit line 26 to detect the presence or absence of the electronic charge and therefore the digital data stored on the flash EEPROM cell. If the floating gate 18 has an electronic charge, the threshold voltage of the memory cell increases and the memory cell does not conduct at the voltage level of the power supply voltage source and the sense amplifier detects a logical "1." Alternately, if there is no electronic charge present on the floating gate 18, the memory cell turns on and the sense amplifier detects a logical "0."

As further described in the SST White Paper and illustrated in U.S. Pat. No. 6,314,022 (Kawata, et al.), U.S. Pat. No. 6,265,266 (Dejenfelt, et al.), U.S. Pat. No. 6,212,102 (Georgakos, et al.), U.S. Pat. No. 5,912,842 (Chang, et al.), and U.S. Pat. No. 5,612,913 (Cappelletti, et al.) a two-transistor thin oxide cell has a select transistor added to the cell to further control the read, program, and erase of the flash EEPROM cell. Refer now to FIG. 1b for an illustration of a two-transistor thin oxide flash EEPROM cell with a select transistor of the prior art. The source of the select transistor is formed of the drain 12 of the memory cell. The drain of the select transistor is formed of the n+ region 32. A layer of poly-crystalline silicon is placed over the thin oxide layer 16 between the source region 12 and the drain region 32 of the select transistor to form the control gate 34 of the select transistor. The control gate 34 is connected to a gate select line 36. The gate select line allows the control of the application of the higher voltages to the memory cell when the flash EEPROM cell is being selected or not selected and thus helps mitigate the effects of the higher voltages on the memory cell.

A split gate flash EEPROM cells, as shown in FIG. 1c, is described in the SST White Paper and illustrated in U.S. Pat. No. 6,212,100 (Choi), U.S. Pat. No. 6,103,576 (Deustcher, et al.), U.S. Pat. No. 6,034,892 (Choi), U.S. Pat. No. 5,859,454 (Choi, et al.), U.S. Pat. No. 5,852,577 (Kianian, et al.). The split gate flash EEPROM cell is formed within a p-type substrate 50. An n+ drain region 52 and an n+ source region 54 are formed within the p-type substrate 50.

A relatively thin gate dielectric 56 is deposited on the surface of the p-type substrate 50. A poly-crystalline silicon floating gate 58 is formed on the surface of the gate dielectric 56 above the channel region 60 between the drain region 52 and source region 54. An interpoly dielectric layer 62 is placed on the floating gate 58 to separate the floating gate 58 from a second layer of poly-crystalline silicon that forms a control gate 64. A field enhancing tunneling injector 63 is formed on the floating gate 58 to assist in erasure of the split gate EEPROM cell. The control gate 64 is formed in stepped fashion having a portion resting on the interpoly dielectric 62 above the floating gate 58 and another portion resting directly upon the gate dielectric 56 essentially forming a two-transistor memory cell as shown in FIG. 2. In FIG. 2, the split gate transistor is represented by the select transistor Txs 72 and the memory transistor Txm 74. The portion of the split gate EEPROM cell representing the select transistor 72 is the region where the control gate 64 is placed on the gate dielectric 56. The portion of the split gate EEPROM cell representing the memory transistor 74 is the region where the control gate is resting upon the interpoly dielectric 62 above the floating gate.

The source region 54 is connected to a source voltage generator through the source line 70. The control gate 68 is connected through the word line 68 to the word line voltage generator. And the drain region 52 is connected through the bit line 66 to the bit line voltage generator.

The split gate flash EEPROM cell is programmed as described in "The Impacts of Control Gate Voltage on the Cycling Endurance of Split Gate Flash Memory," (Huang, et al.), IEEE Electron Device Letters, VOL. 21, NO. 7, July 2000, pp. 359–361, by setting the word line voltage generator to a moderate positive voltage (on the order of 2V). The bit line voltage generator is set to a relatively low positive voltage (on the order of 0.5V), while the source line voltage generator is set to a relatively high positive voltage (on the order of 50V).

With the voltages as described above, hot electrons will be produced in the channel 60 near the source region 54. These hot electrons will have sufficient energy to be accelerated across the gate dielectric 56 and trapped on the floating gate 58. The trapped hot electrons will cause the threshold voltage of the field effect transistor (FET) that is formed by the flash EEPROM cell to be increased by three to five volts. This change in threshold voltage by the trapped hot electrons causes the cell to be programmed.

To erase the flash EEPROM cell the word line voltage generator is set to a relatively large negative voltage (on the order of −11.0v−−13.0v). The source line voltage generator, the bit line voltage generator and the substrate 50 is set to the ground reference potential. Under these conditions there is a large electric field developed across the inter poly dielectric 62. This field causes the electrons trapped in the floating gate 58 to flow to portion of the floating gate 58 in the region of the field enhancing tunneling injector 63. The electrons are then extracted to the control gate 64 by the Fowler-Nordheim tunneling.

The read operation of the split gate flash EEPROM has the word line voltage generator set to approximate the voltage level of the power supply voltage source (on the order of 3.0V) and the bit line voltage generator set to the relatively moderate voltage level sufficient to cause a current to be sensed by sense amplifiers present on the bit line 66. As described above, the charge present on the floating gate 64 determines the threshold voltage of the split gate flash EEPROM cell and whether the data discerned by the sense amplifier is a logical "1" or a logical "0."

"Reliability Considerations for Reprogrammable Nonvolatile Memories," (SST Reliability Paper), staff, Silicon Storage Technology, Inc., November, 2001 Technical Paper found May 7, 2002 www.sst.com, describes the basic failure categories that effect EEPROM cell. The basic failure categories are read faults, retention faults, and endurance faults. The failure rates for read faults and retention faults in the present technologies are sufficiently low that expected failures are in the 100's to 1000's of years and are approaching the intrinsic failure rate of the materials. Thus, the major failure category is the endurance fault.

Endurance is the ability of a flash EEPROM cell to meet its data sheet specifications as a function of accumulated program and erasure cycles over time. The data sheet specifications include write functionality, data retention, and read access time. The endurance faults encompass nine major types. Endurance faults, unlike other MOS reliability concerns, result even though the device is operated within the data sheet limits. The endurance faults occur because the insulators of the gate dielectric and the interpoly dielectric are subjected to electrical stress from the Erase and Programming operations. The basic endurance failure mechanisms are oxide damage and charge trapping caused by the cumulative effects of passing a current through the oxide and placing a high electric field across the oxide. The basic endurance fault modes are:

1. A stuck bit where a bit is unable to change and can be stuck in either logic state. A stuck bit can be caused either by charge trapping or oxide rupture.
2. Retention Degradation where the loss of charge of the floating gate is caused by either trapped charge or damage in the insulating oxide.
3. Read Time Degradation is the gradual increase in the read access time caused by accumulated trapped charge or gradual charge loss reducing the cell current.
4. Erase Time Degradation is the gradual increase in the time required to erase the memory caused by accumulated trapped charge.
5. Program Time Degradation is the gradual increase in the time required to program the memory caused by accumulated trapped charge.
6. Disturbs are an intrinsic phenomena of all memory arrays. A disturb occurs when reading, erasing, or programming one location causes an unwanted alteration at another location.
7. Over erase occurs where device is unable to Read or Program correctly because of excessive memory transistor source to drain current, which grounds the bit line read or programming voltage.
8. Erase Disturb occurs by unintentionally changing the contents in a non-accessed location, while erasing another location. This occurs because the high voltage required to erase may not be isolated from the non-accessed locations.
9. Program Disturb occurs by unintentionally changing the contents in a non-accessed location, while programming another location. This occurs because the high voltage required to Program may not be isolated from the non-accessed locations.

U.S. Pat. No. 5,329,487 (Gupta, et al.) describes a two transistor flash EPROM cell. The two-transistor flash EPROM cell includes a first floating gate transistor for programming the cell and a second merged transistor for reading the cell. The first transistor, a floating gate transistor, has a drain coupled to the write bit line, a gate coupled to the word line, and a source coupled to the source line. The merged transistor effectively consists of a floating gate transistor connected to the floating gate of the first transistor and in series with a NMOS enhancement transistor. The series NMOS transistor has a voltage threshold of about 1 to 2 volts, thus preventing cell activation caused by over erasure (negative voltage threshold) of the floating gate transistor.

U.S. Pat. No. 4,403,307 (Maeda) illustrates an EEPROM cell composed of two double gate type field effect transistors, which each have control gate and floating gate. The structures of the two field effect transistors are essentially identical to that of the stacked gate EEPROM cell as described in FIG. 1a. The sources of the two transistors are commonly connected to a source line, which is connected as described above to a source line voltage generator. The control gates of the two transistors are commonly connected to the word line, which is connected to the word line voltage generator. One of the drains of the two transistors is connected to a read bit line and the drain of the other transistor is connected to a write bit line. The two floating gates are connected such that charge placed on the floating gate of the transistor connected to the write bit line is placed on the floating gate of the transistor of the read bit line.

The reading of the EEPROM cell of Maeda is accomplish through the read bit line voltage generator and sense amplifier connected to the read bit line. The writing of the EEPROM cell of Maeda is accomplished through the write bit line voltage generator connected to the write bit line. Erasure of the EEPROM cell is accomplished with irradiating the cell with ultraviolet light or other radiation.

SUMMARY OF THE INVENTION

An object of this invention is to provide a nonvolatile memory having improved endurance.

Another object of this invention is to provide a nonvolatile memory device having programming circuitry to program a nonvolatile memory and improve the endurance of the nonvolatile memory.

To accomplish at least one of these object and other objects, a nonvolatile memory device is comprised of an array of nonvolatile memory cells arranged in rows and columns. Each memory cell of each row is connected to a word line and a source select line. Each memory cell of each column connected to a first bit line and a second bit line. Each memory cell is composed of a program transistor and a read transistor.

The program transistor has a control gate connected to the word line receive a word line voltage, a drain connected the first bit line to receive a first bit line voltage, a source connected the source select line to receive a source line voltage, and a floating gate onto which an electronic charge is placed representing a data bit stored within the nonvolatile memory device. The a read transistor has a control gate connected to the word line receive the word line voltage, a drain connected to the second bit line to receive a second bit line voltage, a source connected to the source select line to receive the source line voltage, and a floating gate from which the electronic charge is sensed to determine the data bit stored within the nonvolatile memory device.

Each memory cell has a floating gate connector joining the floating gate of the program transistor to the floating gate of the read transistor. The electronic charge representing the data bit is thus present on the floating gate of the read transistor and the floating gate of the program transistor.

The nonvolatile memory device has a voltage controller connected to the program and read transistors to regulate the word line voltage, the first bit line voltage, the second bit line voltage, and the source line voltage to control operation of the nonvolatile memory device. The voltage controller programs the nonvolatile memory device to transfer the electronic charge to the floating gates by adjusting a word line voltage applied to control gates of the program and read transistors to a first moderate positive voltage level of approximately the power supply voltage source, at a first program time. Simultaneously at the first program time, a source line voltage applied to sources of the program and read transistors to a second moderate positive voltage level that is also approximately the power supply voltage source. A first bit line voltage applied to a drain of the program transistors to set the drain of the program transistor to the substrate biasing level. A second bit line voltage applied to a drain of the read transistor is set to a relatively small program voltage of approximately +0.6v.

At a second program time the source line voltage is adjusted to a large positive voltage level. The first bit line voltage to the moderate positive program voltage level that is approximately the power supply voltage source. The programming is completed at a fourth program time by adjusting the word line voltage and the source line voltage to the substrate biasing level. The first bit line is adjusted to the voltage level of the moderate positive program voltage.

In a second embodiment of the nonvolatile memory device, the voltage controller selectively programs the non-volatile memory cells of the array by controlling the transfer of electronic charge to the floating gates by adjusting a word line voltage applied to control gates of the program and read transistors to a first moderate positive voltage level of approximately +2.0v. The source line voltage applied to sources of the program and read transistors to a second moderate positive voltage level that is approximately the voltage level of the power supply voltage source. The first and second bit line voltages are adjusted to the moderate positive program level of that is approximately the power supply voltage source. At a second program time, the source line voltage is adjusted to a large positive voltage level and the first bit line voltage to a first small positive voltage level. The first and second bit line voltages are adjusted to a relatively small program voltage level of approximately +0.6v. At a third program time, the first and second bit line voltages are adjusted to the moderate positive program voltage level that is approximately the power supply voltage source. The programming is completed at a fourth program time, by adjusting the word line voltage and the source line voltage to the substrate biasing level. The first and second bit line voltages are adjusted to the moderate positive program voltage level that is approximately the power supply voltage source.

The voltage controller performs a read of nonvolatile memory cells of array by adjusting the word line voltage to the first moderate positive voltage level and the source line voltage and the first and second bit line voltages to the substrate biasing level at a first read time. At a second read time, the second bit line voltage is adjusted to a relatively small positive voltage level of approximately +1.0v. The read operation is completed at a third read time by adjusting the word line voltage and the second bit line voltage to the substrate biasing level.

In the second embodiment of nonvolatile memory device, the voltage controller selectively performs a read of the nonvolatile memory cells of the array by adjusting the word line voltage to the first moderate positive voltage level and the source line voltage and the first and second bit line voltages to the substrate biasing level at a first read time. At a second read time, the first and second bit line voltages are adjusted to a relatively small positive voltage level of approximately +1.0v. The read is completed at a first read time, by adjusting the word line voltage and the second bit line voltage to the substrate biasing level.

The voltage controller selectively performs an erase of the nonvolatile memory cells of the array by adjusting the word line voltage to the second moderate positive voltage level and the source line voltage and the first and second bit line voltages to the substrate biasing level at a first erase time. The word line voltage is adjusted to the large positive voltage level at a second erase time. The erase is completed at a third erase time, by adjusting the word line voltage to the substrate biasing level.

BRIEF DESCRIPTION OF THE DRAWINGS

FIGS. 1a–1c are diagrams of cross sections of the structure of nonvolatile flash memory cells of the prior art.

FIG. 2 is schematic diagram of representing an equivalent circuit of a split gate flash memory cell of FIG. 1c.

FIG. 3a–3c are diagrams of cross sections of a nonvolatile memory cell of this invention.

FIGS. 5a is a timing diagram of a read operation of the nonvolatile memory cell of this invention.

FIGS. 5b is a timing diagram of a program operation of the nonvolatile memory cell of this invention.

FIGS. 6a is a timing diagram of a second embodiment of a read operation of the nonvolatile memory cell of this invention.

FIG. 6b is a timing diagram of a second embodiment program operation of the nonvolatile memory cell of this invention.

FIG. 7 is a plot of the cell current versus the number of cells to show the change over time of the cell current for the programming of the first and second embodiments of the nonvolatile memory cells of this invention.

FIG. 8 is a plot of the cell current versus the number of cells programmed and erased illustrating the change in the cell current over time for the nonvolatile memory cells of this invention compared with the nonvolatile memory cells of the prior art.

DETAILED DESCRIPTION OF THE INVENTION

The nonvolatile memory cell of this invention is a formed of two split gate transistors. Each transistor has a floating gate and a control gate.

The control gate overlapping the floating gate and having a portion placed on the thin gate dielectric similar to that shown in FIG. 1c. The floating gates are joined with a floating gate connector. Generally the control gates are connected to a word line of an array and the sources of the two transistors are connected to a source line of the array. The drain of one transistor is connected to a bit line used for programming the memory cell and the drain of the read transistor is connected to a bit line used for reading the cell.

In a first embodiment, the programming is accomplished by applying a large positive voltage to the source line and a small negative voltage to the bit line connected to the drain of the first transistor. A moderate positive voltage is applied to the word line and thus to the control gates of the two transistors. This causes electrical charges to traverse from the source of the program transistor to the floating gate of the program transistor and across the joining floating gate connector to the second connector.

In a second embodiment, the programming is accomplished by first applying the moderate positive voltage to the drain of the program transistor for a shorter period of time, removing the voltage, and then applying the moderate positive voltage to the drain of the read transistor.

This improves the endurance of the nonvolatile memory cell by decreasing the stress of gate dielectric between the source and the floating gate of the first transistor.

Figure 3C:
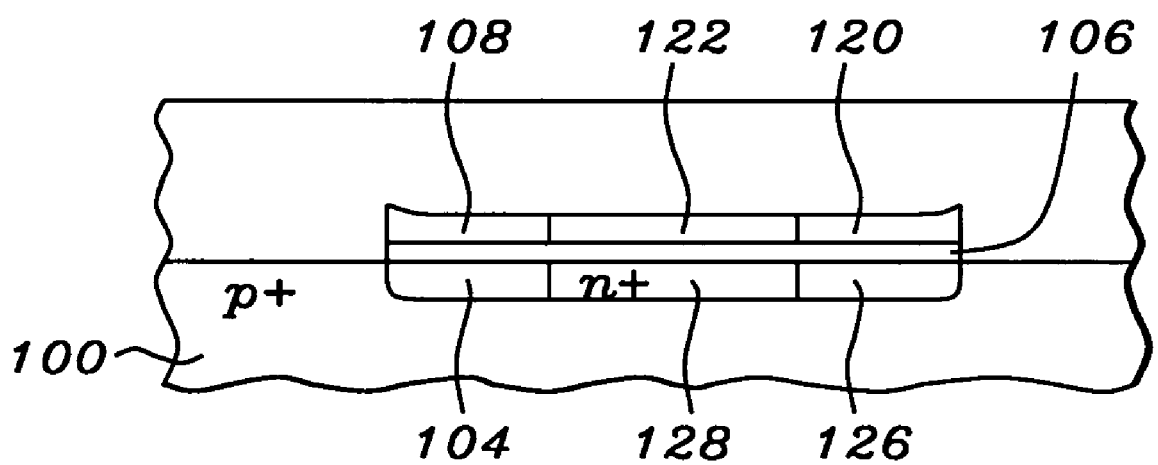
Figure 3D:
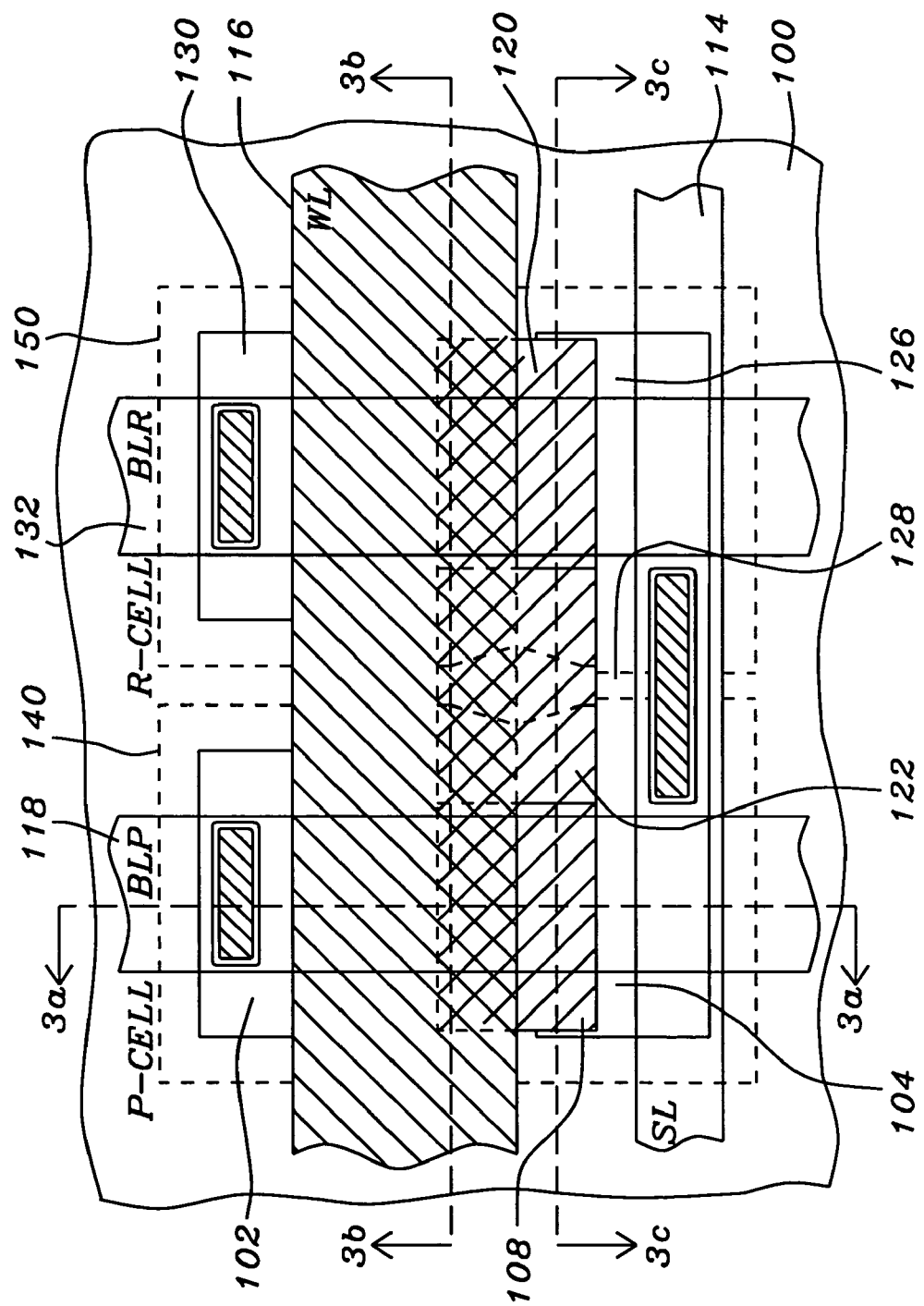
FIG. 3d is a top plan view of the structure of the nonvolatile memory cell of this invention.

Refer now to FIGS. 3a–3d for a description of the structure of the nonvolatile memory cell of this invention. In the preferred embodiment, n+ regions are diffused into a p-type substrate to form the sources 104 (FIGS. 3a–3d) and 126 (FIGS. 3c–3d) and drains 102 (FIG. 3a and FIG. 3d) and 130 (FIGS. 3c–3d) of the program cell 140 (FIGS. 3d) and the read cell 150 (FIG. 3d) of the nonvolatile memory cell of this invention. The sources 104 (FIG. a and FIGS. 3c–3d) and 126 (FIGS. 3c–3d) and drains 102 (FIGS. 3a–3d) and 130 (FIG. 3d) are separated by a space that forms a channel 105 (FIG. 3a). Above the channel 105 (FIG. 3a), a gate dielectric or tunneling oxide 106 (FIGS. 3a–3c) is deposited upon the substrate 100 (FIGS. 3a–3d). Above the gate dielectric 106 (FIGS. 3a–3c), a first layer of polycrystalline silicon is formed to create the floating gates 108 (FIGS. 3a–3d) and 120 (FIGS. 3b–3d) and a floating gate connector 122 (FIGS. 3b–3d). The floating gate connector 122 (FIGS. 3b–3d) joins the floating gates 108 (FIGS. 3a–3d) and 120 (FIGS. 3b–3d) of the transistor of the program cell 140 (FIG. 3d) and the transistor of the read cell 150 (FIG. 3d).

An interpoly dielectric 112 (FIGS. 3a–3b) is formed above the floating gates 108 (FIGS. 3a–3d) and 120 (FIGS. 3b–3d) and a floating gate connector 122 (FIGS. 3b–3d). Openings are formed in the interpoly dielectric 112 (FIGS. 3a–3b) and then a second polycrystalline silicon layer is formed on the surface of the interpoly dielectric 112 (FIGS. 3a–3b) to produce the control gates 110 (FIGS. 3a–3b) and 124 (FIG. 3b). The control gates 110 (FIGS. 3a–3b) and 124 (FIG. 3b) are connected to the word line WL 116 (FIGS. 3a–3b and FIG. d).

The sources 104 (FIG. a and FIGS. 3c–3d) and 126 (FIGS. 3c–3d) are connected to the source line SL 114 and drains 102 (FIG. 3a and FIG. 3d) and 130 (FIGS. 3c–3d) are connected respectively to the program bit BLP line 118 (FIG. 3a and FIG. 3d) and the read bit line BLR 132 (FIG. 3d). The sources 104 (FIG. a and FIGS. 3c–3d) and 126 (FIGS. 3c–3d) are formed by the n+ diffusion to have a connector 128 (FIGS. 3c–3d) thus joining the sources 104 (FIG. a and FIGS. 3c–3d) and 126 (FIGS. 3c–3d).

Figure 3E:
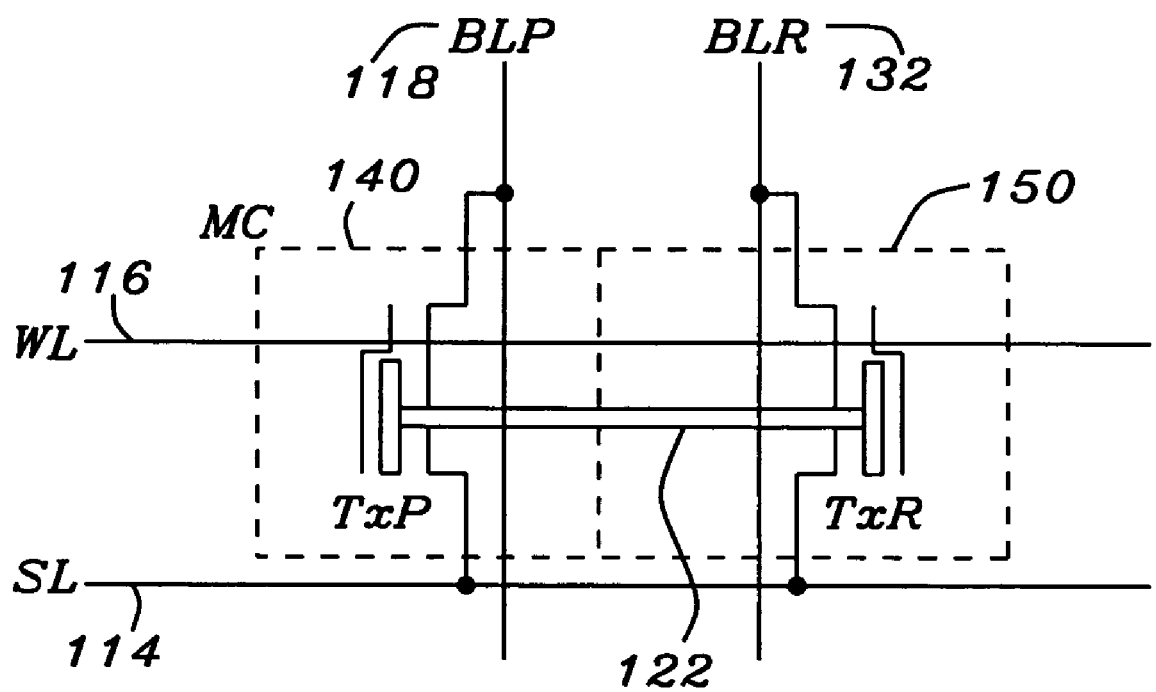
FIG. 3e is a schematic diagram of the nonvolatile memory cell of this invention.

FIG. 3e is a schematic diagram of illustrating the equivalent circuit of the nonvolatile memory cell MC of this invention. The memory cell MC is formed of the program cell 140 and a read cell 150. The program cell 140 is formed by the transistor TxP and the read cell is formed by the transistor TxR. The floating gates as described above are joined by the connector 122. As described above, the sources of the transistors 140 and 150 are connected to the source line 114. The control gates are connected to the word line 140. The drain of the transistor TxP is connected to the program bit line 118 and the drain of the transistor TxR is connected to the read bit line 132.

Figure 4:
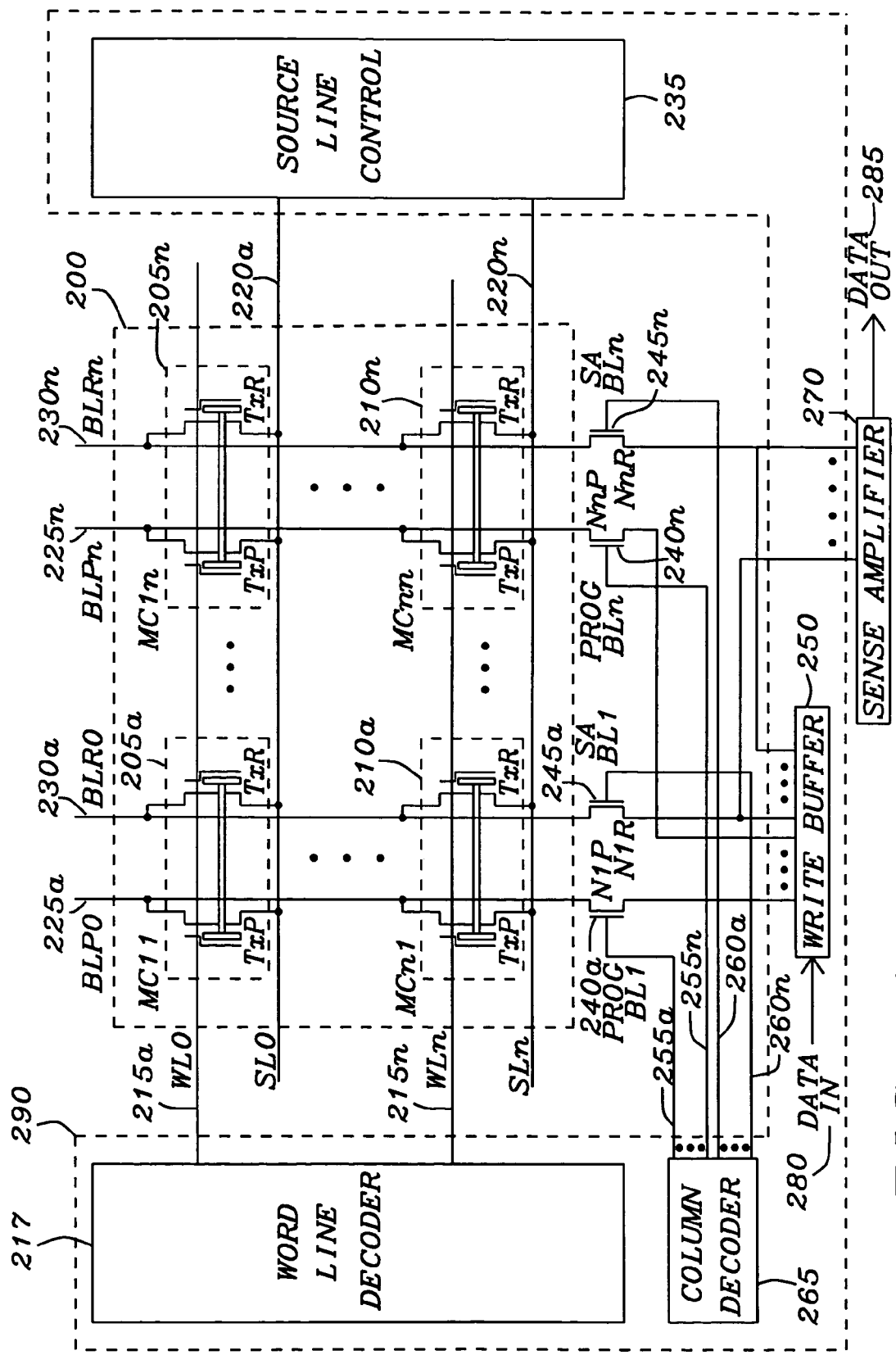
FIG. 4 is a schematic diagram of the nonvolatile memory array device of this invention.

Nonvolatile memory devices of this invention are formed, as shown in FIG. 4, as an array 200 of the nonvolatile memory cells MC11, . . . , MC1n 205a, . . . , 205n, MCn1, . . . , MCnn 210a, . . . , 210n arranged in rows and columns. Each of the nonvolatile memory cells MC11, . . . , MC1n 205a, . . . , 205n, MCn1, . . . , MCnn 210a, . . . , 210n is structured as described in FIGS. 3a–3e. The control gates of each of the transistors TxP and TxR of each row of the nonvolatile memory cells MC11, . . . , MC1n 205a, . . . , 205n, MCn1, . . . , MCnn 210a, . . . , 210n are connected to the word lines WL0, . . . , WLn 215a, . . . , 215n. The word lines WL0, . . . , WLn 215a, . . . , 215n are all connected to the word line decoder 217. The word line decoder 217 receives an address of the nonvolatile memory cells MC11, . . . , MC1n 205a, . . . , 205n, MCn1, . . . , MCnn 210a, . . . , 210n to which a read, program, or erase operation is to be effected. Depending on the type of operation (read, program, or erase), the word line decoder 217 generates the necessary voltages that need to be applied to the gates of the nonvolatile memory cells MC11, . . . , MC1n 205a, . . . , 205n, MCn1, . . . , MCnn 210a, . . . , 210n.

The sources of each of the transistors TxP and TxR of each row of the nonvolatile memory cells MC11, . . . , MC1n 205a, . . . , 205n, MCn1, . . . , MCnn 210a, . . . , 210n are connected to the source lines SL0, . . . , SLn 220a, . . . , 220n. The source lines SL0, . . . , SLn 220a, . . . , 220n are all connected to the source line control circuit 235. The source line control circuit 235 receives appropriate address and control signals to select which of the source lines SL0, . . . , SLn 220a, . . . , 220n are activated for which of the read, program, or erases operations. The source line control circuit 235 generates the necessary voltage for performing the desired operations on the selected nonvolatile memory cells MC11, . . . , MC1n 205a, . . . , 205n, MCn1, . . . , MCnn 210a, . . . , 210n.

The drains of each of the program transistors TxP of each column of the nonvolatile memory cells MC11, . . . , MC1n 205a, . . . , 205n, MCn1, . . . , MCnn 210a, . . . , 210n are connected to the program bit lines BLP0, BLPn 225a, . . . , 225n. Each of the program bit lines BLP0, . . . , BLPn 225a, . . . , 225n are connected to the drain of one of the program control transistors N1P, . . . , NnP 240a, . . . , 240n. The source of each of the program control transistors N1P, . . . , NnP 240a, . . . , 240n is connected to the write buffer circuit 250.

The drains of each of the read transistors TxR of each column of the nonvolatile memory cells MC11, . . . , MC1n 205a, . . . , 205n, MCn1, . . . , MCnn 210a, . . . , 210n are connected to the read bit lines BLR0, . . . , BLRn 225a, . . . , 225n. Each of the read bit lines BLR0, . . . , BLRn 230a, . . . , 230n are connected to the drain of one of the read control transistors N1R, . . . , NnR 245a, . . . , 245n. The source of each of the read control transistors N1R, . . . , NnR 245a, . . . , 245n is connected to the write buffer circuit 300 and to the sense amplifier 270.

The write buffer 250 receives the input data 280 and then generates the appropriate voltage levels and timings to be applied to selected nonvolatile memory cells MC11, . . . , MC1n 205a, . . . , 205n, MC11, . . . , MC1n 210a, . . . , 210n for programming these desired memory cells. The gates of the program control transistors N1P, . . . , NnP 240a, . . . , 240n are connected through the program control bit lines PROG BL1, . . . , PROG BLn1 255a, . . . , 255n to the column decoder 265. The gates of the read control transistors N1R, . . . , NnR 245a, . . . , 245n are connected through the read control bit lines SA BL1, . . . , SA BLn1 260a, . . . , 260n to the column decoder 265. The column decoder 265 receive a portion of the address that is used to select a column of the array 200 to apply the appropriate voltages from the write buffer for programming the selected nonvolatile memory cells MC11, . . . , MC1n 205a, . . . , 205n, MCn1, . . . , MCnn 210a, . . . , 210n.

During a read operation, the column decoder 265 decodes the address to generate the appropriate selections signals to be applied to the nonvolatile memory cells MC11, . . . , MC1n 205a, . . . , 205n, MCn1, . . . , MCnn 210a, . . . , 210n to connect the selected columns to the sense amplifier 270. The sense amplifier 270 detects the presence or absence of electrical charge, as described above, to determine the digital data stored within the memory array 200. The sense amplifier 270 regenerates the digital data from the memory array 200 to create the digital data output signals 285.

Figure 5C:
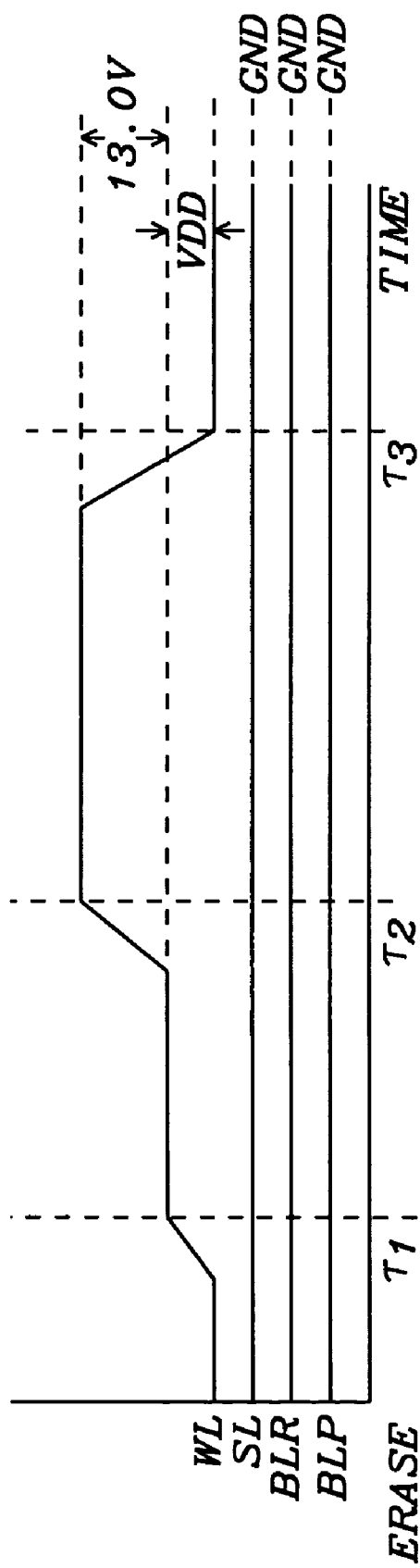
FIGS. 5c is a timing diagram of a erase operation of the nonvolatile memory cell of this invention.

The word line decoder 217, the source line control circuit 235, the write buffer 250, and the column decoder 265, collectively act as a voltage generator and control circuit 290 that provides the necessary voltages and timings of those voltages to perform the read, program, and erase of selected nonvolatile memory cells MC11, . . . , MC1n 205a, . . . , 205n, MCn1, . . . , MCnn 210a, . . . , 210n of the memory array 200. A first embodiment of the voltage generator and control circuit 290 executes the read, program, and erase operations by providing the word line voltage WL, the source line voltage SL, the read bit line voltage BLR, and the program bit line voltage BLP as shown in FIGS. 5a–5c plotted versus time (TIME). The read operation as executed by the voltage generator 290 is shown in FIG. 5a. At a first read time $\tau_1$, the word line decoder 217 adjusts the word line voltage WL of the selected word line 215a, . . . , 215n to a moderately high positive voltage. Generally, the word line voltage WL is on the order the voltage level of the power supply voltage source.

At a second read time $\tau_2$, the column decoder activates a desired read control bit line SA BL1, . . . , SA BLn1 260a, . . . , 260n to activate the desired read control transistors N1R, . . . , NnR 245a, . . . , 245n to effectively connect the read bit lines BLR0, . . . , BLRn 230a, . . . , 230n to the write buffer 250. The write buffer 250 generates a read bit line voltage BLR that is a relatively small positive read voltage. The relatively small positive read voltage is approximately +1.0v. The read bit line voltage BLR is further chosen such that the current through the selected read transistor TxR is sufficient for detection by the sense amplifier 270.

The source line control circuit 235 sets the source lines SL0, . . . , SLn 220a, . . . , 220n to source line voltage SL that is the voltage level of the substrate voltage reference source or approximately zero volts. Further program bit lines BLP0, . . . , BLPn 225a, . . . , 225n are placed at the program bit line voltage BLP that is the voltage level of the substrate voltage reference source during the read operation. At the time $\tau_3$, the read operation is completed by the voltage generator 290 setting word line voltage WL and thus the word lines WL0, . . . , WLn 215a, . . . , 215n and the read bit line voltage BLR and thus the read bit lines BLR0, . . . , BLRn 230a, . . . , 230n to the voltage level of the substrate voltage source. The read set up time is the elapsed time from the first read time $\tau_1$ until the second read time $\tau_2$ and is more than 20 μs. The read time is the elapsed time from the second read time $\tau_2$ until the third read time $\tau_3$ and is approximately 20 μs.

The program operation as executed by the voltage generator 290 is shown in FIG. 5b. At a first program time $\tau_1$, the word line decoder 217 adjusts the word line voltage WL of the selected word line WL0, . . . , WLn 215a, . . . , 215n to a first moderately high positive voltage level and the source line control circuit 235 adjusts the source line voltage SL and thus the source lines SL0, . . . , SLn 220a, . . . , 220n to a second moderately high positive voltage level. The column decoder activates a desired program control bit line PROG BL1, . . . , PROG BLn1 255a, . . . , 255n to activate the desired program control transistors N1P, . . . , NnP 240a, . . . , 240n to effectively connect the program bit lines BLP0, . . . , BLPn 225a, . . . , 225n to the write buffer 250. The column decoder also activates a desired read control bit line SA BL1, . . . , SA BLn1 260a, . . . , 260n to activate the desired read control transistors N1R, . . . , NnR 245a, . . . , 245n to effectively connect the read bit lines BLR0, . . . , BLRn 230a, . . . , 230n to the write buffer 250. The write buffer 250 is set to the second moderately high voltage level. Generally, first moderately high positive voltage level is on the order the voltage level of approximately +2.0v. Similarly, the second moderately high positive voltage level is on the order the voltage level of the power supply voltage source.

At a second program time T2, the source line control circuit 235 adjusts source line voltage SL and thus the source lines SL0, . . . , SLn 220a, . . . , 220n to a relatively high positive voltage level. The relatively high positive voltage level of the source lines SL0, . . . , SLn 220a, . . . , 220n is on the order +10.0v.

At a third program time $\tau_3$, the write buffer 250 applies a current source to the program control bit line PROG BL1, . . . , PROG BLn1 255a, . . . , 255n. The application of the current source pulls the level of the program bit line voltage BLP to a level of a approximately 0.6V.

The completion of the program operation begins at the program time $\tau_4$ when the write buffer 250 generates a program bit line voltage BLP to the voltage level that is on the order the voltage level of the power supply voltage source. The completion of the program operation ends at the time $\tau_5$, when the word line decoder 217 returns the selected word line WL0, . . . , WLn 215a, . . . , 215n and the source line control circuit returns the source line voltage SL and thus the source lines SL0, . . . , SLn 220a, . . . , 220n to the voltage level of the substrate biasing voltage source. The column decoder deactivates a desired program control bit line PROG BL1, . . . , PROG BLn1 255a, . . . , 255n to deactivate the desired program control transistors N1P, . . . , NnP 240a, . . . , 240n to effectively disconnect the program bit lines BLP0, . . . , BLPn 225a, . . . , 225n from the write buffer 250. The column decoder deactivates a desired read control bit line SA BL1, . . . , SA BLn1 260a, . . . , 260n to deactivate the desired read control transistors N1R, . . . , NnR 245a, . . . , 245n to effectively disconnect the read bit lines BLR0, . . . , BLRn 230a, . . . , 230n from the write buffer 250. This effectively sets disconnect the program bit lines BLP0, . . . , BLPn 225a, . . . , 225n and the read bit lines BLR0, . . . , BLRn 230a, . . . , 230n to the voltage level of the substrate biasing voltage source (approximately 0V or the ground reference voltage).

The first program set up time is the elapsed time from the first program time $\tau_1$ until the second program time $\tau_2$ and is approximately 10 μs. The second program set up time is the elapsed time from the second program time $\tau_2$ until the third program time $\tau_3$ and is less than 10 μs. The program time is the elapsed time from the third program time $\tau_3$ until the fourth program time $\tau_4$ and is nominally 40 μs. The program completion time is the elapsed time for the termination of the program operation, which extends from the fourth program time $\tau_4$ to the fifth program time $\tau_5$. The program completion time has a duration of approximately 10 μs.

In the implementation of the first embodiment of the voltage control circuit 290, the read bit line voltage BLR and thus the read bit lines BLR0, . . . , BLRn 230a, . . . , 230n are set to the voltage level of the a relatively small program voltage level of +0.6v during a program operation.

A second embodiment of the voltage generator and control circuit 290 executes the read, program, and erase operations by providing the word line voltage WL, the source line voltage SL, the read bit line voltage BLR, and the program bit line voltage BLP as shown in FIGS. 6a and 6b plotted versus time (TIME). The read operation as executed by the voltage generator 290 is shown in FIG. 6a. At a first read time $\tau_1$, the word line decoder 217 adjusts the word line voltage WL of the selected word line WL0, . . . , WLn 215a, . . . , 215n to a moderate positive read voltage. Generally, the moderate high positive read voltage is on the order the voltage level of +2.0v.

At a second read time $\tau_2$, the column decoder activates a desired program control transistors N1P, . . . , NnP 240a, . . . , 240n to effectively connect the program bit lines BLP0, . . . , BLPn 225a, . . . , 225n and read control bit line SA BL1, . . . , SA BLn1 260a, . . . , 260n to activate the desired read control transistors N1R . . . . , NnR 245a, . . . , 245n to effectively connect the program bit lines BLP0, . . . , BLPn 225a, . . . , 225n and the read bit lines BLR0, . . . , BLRn 230a, . . . , 230n to the write buffer 250. The write buffer 250 generates a program bit line voltage BLP and a read bit line voltage BLR that is a relatively small positive voltage. The relatively small positive voltage is approximately +1.0v. The bit line voltage BLR is further chosen such that the current through the selected read transistor TxR is sufficient for detection by the sense amplifier 270.

The source line control circuit 235 sets the source line voltage SL and thus the source lines SL0, . . . , SLn 215a, . . . , 215n to the voltage level substrate voltage reference source or approximately zero volts. At the time $\tau_3$, the read operation is completed by the voltage generator 290 setting word line voltage WL and thus the word lines WL0, . . . , WLn 215a, . . . , 215n, the program bit lines BLP0, . . . , BLPn 225a, . . . , 225n and the read bit line voltage BLR and thus the read bit lines BLR0, . . . , BLRn 230a, . . . , 230n to the voltage level of the substrate voltage source. The read set up time is the elapsed time from the first read time $\tau_1$ until the second read time $\tau_2$ and is approximately 10 μs. The read time is the elapsed time from the second read time $\tau_2$ until the third read time $\tau_3$ and is approximately 20 μs.

The program operation as executed by the second embodiment of the voltage generator 290 is shown in FIG. 6b. At a first program time $\tau_1$, the word line decoder 217 adjusts the word line voltage WL of the selected word line 215a, . . . , 215n to a first moderately high positive voltage level and the source line control circuit 235 adjusts source line voltage SL and thus the source lines 220a, . . . , 220n to a second moderately high positive voltage level. Generally, the moderately high positive voltage level is on the order the +2.0v. Similarly, the second moderately high positive voltage level is on the order the voltage level of the power supply voltage source.

At the first program time $\tau_1$, the column decoder activates a desired program control transistors N1P, . . . , NnP 240a, . . . , 240n to effectively connect the program bit lines BLP0, . . . , BLPn 225a, . . . , 225n and read control bit line SA BL1, ..., SA BLn1 260a, ..., 260n to activate the desired read control transistors N1R, ..., NnR 245a, ..., 245n to effectively connect the program bit lines BLP0, ..., BLPn 225a, ..., 225n and the read bit lines BLR0, ..., BLRn 230a, ..., 230n to the write buffer 250. The write buffer 250 generates a program bit line voltage BLP and a read bit line voltage BLR that is a moderately high positive voltage. The moderately high positive voltage is approximately the voltage level of the power supply voltage source.

At a second program time $\tau_2$, the source line control circuit 235 adjusts source line voltage SL and thus the source lines SL0, ..., SLn 220a, ..., 220n to a relatively high positive voltage level. The relatively high positive voltage level of the source lines SL0, ..., SLn 220a, ..., 220n is on the order +10.0v.

Simultaneously, at the second program time $\tau_2$, the write buffer 250 generates a constant current that is applied to the selected bit line of the program bit lines BLP0, ..., BLPn 225a, ..., 225n. This constant current pulls the program bit line voltage BLP to a relatively small positive program voltage. The relatively small positive program voltage is approximately +0.6v.

At a third program time $\tau_3$, the write buffer 250 adjusts the program bit line voltage BLP to the moderately high positive voltage and applies the constant current to the read bit lines BLR0, ..., BLRn 230a, ..., 230n. This constant current similarly pulls the program bit line voltage BLP to the relatively small positive program voltage of approximately +0.6v. AT the fourth program time $\tau_4$, the write buffer removes the constant current source and returns the read bit lines BLR0, ..., BLRn 230a, ..., 230n to the moderately high positive voltage level (approximately power supply voltage source).

The completion of the program operation begins at the fifth program time $\tau_5$ when the write buffer 250 adjusts the program bit line voltage BLP and the read bit line voltage BLR to the voltage level of the to the moderately high positive voltage (the power supply voltage source). The word line decoder 217 returns word line voltage WL and thus the selected word line 215a, ..., 215n and the source line control circuit returns source line voltage SL and thus the source lines SL0, ..., SLn 220a, ..., 220n to the voltage level of the substrate biasing voltage source. The column decoder deactivates a desired program control bit line PROG BL1, ..., PROG BLn1 255a, ..., 255n to deactivate the desired program control transistors N1P, ..., NnP 240a, ..., 240n to effectively disconnect the program bit lines BLP0, ..., BLPn 225a, ..., 225n from the write buffer 250. The column decoder deactivates a desired read control bit line SA BL1, ..., SA BLn1 260a, ..., 260n to deactivate the desired read control transistors N1R, ..., NnR 245a, ..., 245n to effectively disconnect the read bit lines BLR0, ..., BLRn 230a, ..., 230n from the write buffer 250. This effectively sets disconnect the program bit lines BLP0, ..., BLPn 225a, ..., 225n and the read bit lines BLR0, ..., BLRn 230a, ..., 230n to the voltage level of the substrate biasing voltage source (approximately 0V or the ground reference voltage).

The first program set up time is the elapsed time from the first program time $\tau_1$ until the second program time $\tau_2$ less than 10µs. The first program time is the time in which the initial programming is performed from the source to the floating gate of the program transistor TxP and has an elapsed time from the second program time $\tau_2$ until the third program time $\tau_3$. The first program time duration is normally approximately 20 µs. The second program time is the time in which the programming operation is continued with the transfer of the electronic charge from the source to the floating gate of the read transistor TxR and is elapsed time from the third program time $\tau_3$ until the fourth program time $\tau_4$. The second program time duration is normally approximately 20 µs. The program completion time is the elapsed time for the termination of the program operation, which extends from the fourth program time $\tau_4$ to the fifth program time $\tau_5$. The program completion time has a duration less than 10 µs.

The erase operation as executed by the first and second embodiments of the voltage generator 290 is shown in FIG. 5c. At a first erase time $\tau_1$, the word line decoder 217 adjusts the word line voltage WL of the selected word line WL0, ..., WLn 215a, ..., 215n to a first moderately high positive voltage level. At a second erase time $\tau_2$, the word line decoder 217 adjust the word line voltage WL of the selected word line WL0, ..., WLn 215a, ..., 215n to a relatively large positive voltage. At a third erase time $\tau_3$, the erase operation is complete when the word line decoder 217 adjusts the word line voltage WL of the selected word line WL0, ..., WLn 215a, ..., 215n to the voltage level of the substrate biasing voltage source.

During the entire erase operation the voltage generator 290 sets the source line voltage SL and thus the source lines SL0, ..., SLn 220a, ..., 220n, the program bit line voltage BLP and thus the program bit lines BLP0, ..., BLPn 225a, ..., 225n, and the read bit line voltage BLR and thus the read bit lines BLR0, ..., BLRn 230a, ..., 230n to the voltage level of the substrate biasing voltage source. Having the selected word line WL0, WLn 215a, ..., 215n at the relatively large positive voltage causes any electronic charge present on the floating gates of the program transistor TxP and the read transistor TxR to flow to the selected word line WL0, ..., WLn 215a, ..., 215n by Fowler-Nordheim tunneling. The relatively large positive voltage is approximately 13v. The erase set up time is from the first erase time $\tau_1$ to the second erase time $\tau_2$ and has a duration less than 5 ms. The erase time is from the second erase time $\tau_2$ to the third erase time $\tau_3$ and has a duration of approximately 10 ms.

FIG. 7 illustrates the comparison of the degradation of the cell currents versus the number of bits of a nonvolatile memory cell of the prior art subjected to a longer and a shorter program pulse. The current through the transistor of the nonvolatile memory cells are measured as programmed and erased and plotted. The plot 300 illustrates a distribution of the nonvolatile memory cells, as initially manufactured, having a 40 µs program pulse. This is similar to the program pulse between program time $\tau_2$ and $\tau_5$ of FIG. 5b. The plot 305 illustrates the distribution of the nonvolatile memory cells, as initially manufactured, having a 20 µs program pulse. The plot 310 illustrates the nonvolatile memory cells having the 40 µs program pulse after 30,000 program/erase cycles and the plot 315 illustrates the distribution of the nonvolatile memory cells having the 20 µs program pulse after 30,000 program/erase cycles. It is apparent that the shorter program pulse of the nonvolatile memory cells causes less degradation of the cell current of the nonvolatile memory cells.

FIG. 8 compares the distribution of the cell currents for the single split gate nonvolatile memory cells using the 40 µs program pulse similar to that described in FIG. 7. The three essentially overlaid plots 320 illustrate the distribution of the cell current of the single transistor split gate nonvolatile memory cell of FIG. 1c, the current of the program transistor TxP, and the current of the TxR of the nonvolatile memory cell of this invention as initially manufactured. The plots 335, 340, and 395 respectively are the distribution of the cell currents of the single transistor split gate nonvolatile memory cell of FIG. 1c and the program transistor TxP and the TxR of the nonvolatile memory cell of this invention after 600,000 program/erase cycles. The plot 340 shows that the distribution of the cell currents of the program transistor TxP has a greater degradation than cell currents of the single transistor of the nonvolatile memory cell of FIG. 1c of the plot 335. Further, the plot 395 demonstrates that the read transistor TxR actually has only a marginal degradation after the 600,000 program/erase cycles.

Figure 9:
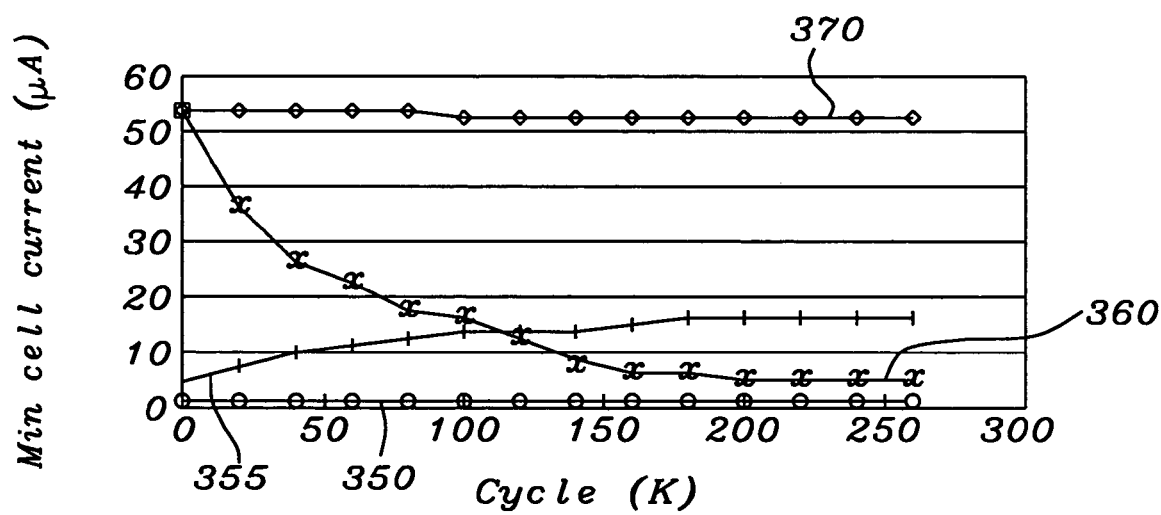
FIG. 9 is plot of the cell current versus time comparing the nonvolatile memory cells of this invention with the nonvolatile memory cells of the prior art.

The results as demonstrated in FIGS. 7 and 8 show that the effects of a shorter program pulse prevents degradation as shown. This phenomena led to the development of the two stage program operation of the second embodiment of the voltage generator 290 of this invention. FIG. 9 contains plots of the minimum cell current for 4000 nonvolatile memory cells having 300,000 program/erase cycles. The plot 350 is the plot of the programmed cell current for the split-gate single transistor nonvolatile memory cell of prior art. The plot 355 is the plot of the programmed cell current for the first embodiment of the nonvolatile memory cell of this invention. It can be seen that the single programming pulse causes some degradation of the memory cell over the numbers of program/erase cycles.

The plot 360 illustrates the erased cell current of the single transistor nonvolatile memory cell of the prior art as shown in FIG. 1c. The plot 370 is of the programmed cell current of the two transistor nonvolatile memory cell of this invention. As is known, the differential between the programmed cell current and the erased cell current determines the ability of the sense amplifier of the nonvolatile memory device to distinguish between a logical "1" and logical "0" of the digital data. A wider differential indicates that the nonvolatile memory has better endurance. The differential in the plots 350 and 360 of the nonvolatile memory cell of FIG. 1c indicates that the endurance of the device significantly deteriorates beyond 100,000 program erase cycles.

The differential between the plots 355 and 370 is significantly greater than those of the nonvolatile memory cell of the prior art, thus demonstrating that the programmed and erased cells of this invention have improved reliability.

While this invention has been particularly shown and described with reference to the preferred embodiments thereof, it will be understood by those skilled in the art that various changes in form and details may be made without departing from the spirit and scope of the invention.

The invention claimed is:

1. A method of operation of a nonvolatile memory device including a program transistor and a read transistor having connected floating gates formed within a substrate, said method comprising:
   programming said nonvolatile memory device to transfer said electronic charge to said floating gates by the steps of:
   adjusting a word line voltage applied to control gates of said program and read transistors to a moderate positive programming voltage level,
   adjusting a source line voltage applied to sources of said program and read transistors to a large positive program voltage level,
   applying a current source to a first bit line connected to a drain of the first transistor to pull said drain of the program transistor to a first relatively small positive programming voltage level, and adjusting a second bit line voltage applied to a drain of the read transistor to a second relatively small programming voltage level.

2. The method of claim 1 further comprising: reading the nonvolatile memory device by:
   adjusting said word line voltage to the moderate positive read voltage level;
   adjusting the second bit line voltage to the a relatively small positive read voltage level; and
   adjusting the source line voltage and the first bit line voltage to the substrate biasing level.

3. The method of claim 1 further comprising: erasing the nonvolatile memory device by
   adjusting, said source line voltage and the first and second bit line voltages to the substrate biasing level; and
   adjusting the word line voltage to the large positive erase voltage level.

4. The method of claim 1 wherein the moderate positive program voltage level has a voltage level equal to the voltage level of a power supply voltage source.

5. The method of claim 1 wherein the large positive program voltage level has a voltage range of from approximately +10.0 v to approximately 13.0 v.

6. The method of claim 1 wherein the substrate biasing level is approximately a ground reference voltage level.

7. The method of claim 1 wherein the first and second relatively small program voltage levels each have a voltage level of approximately +0.6v.

8. The method of claim 1 wherein a program time is an elapsed time at which the negative program voltage is applied to the drain of the program transistor and is approximately 40 μsec.

9. The method of claim 2 wherein the moderate read voltage level is approximately +5.0 v.

10. The method of claim 2 wherein the substrate biasing level is approximately a ground reference voltage level.

11. The method of claim 2 wherein the relatively small positive read voltage level is approximately +0.6 v.

12. The method of claim 2 wherein the read time is an elapsed time at which the small positive read voltage is applied to the drain of the read transistor and is approximately 20 μsec.

13. The method of claim 3 wherein the large positive erase voltage level has a voltage range of from approximately +10.0 v to approximately +13.0 v.

14. The method of claim 3 wherein the substrate biasing level is approximately a ground reference voltage level.

15. The method of claim 3 wherein an erase time is an elapsed time at which the large positive erase voltage level is applied to the control gates of the program and read transistors and is approximately 10 msec.

16. A nonvolatile memory device comprising:
   a program transistor having a control gate connected to selectively receive a word line voltage, a drain connected to receive a first bit line voltage, a source connected to receive a source line voltage, and a floating gate onto which an electronic charge is placed representing a data bit stored within said nonvolatile memory device;
   a read transistor having a control gate connected to selectively receive the word line voltage, a drain connected to receive a second bit line voltage, a source connected to receive the source line voltage, and a floating gate from which the electronic charge is sensed to determine the data bit stored within said nonvolatile memory device;
   a floating gate connector joining the floating gate of the read transistor to the floating gate of the read transistor such that the electronic charge representing the data bit is present on the floating gate of the read transistor and the floating gate of a second transistor;

a voltage controller connected to the program and read transistors to regulate the word line voltage, the first bit line voltage, the second bit line voltage, and the source line voltage to control operation of said nonvolatile memory device, said voltage controller is configured to;

program said nonvolatile memory device to transfer said electronic charge to said floating gates by:

adjusting a word line voltage applied to control gates of said program and read transistors to a moderate positive programming voltage, adjusting a source line voltage applied to sources of said program and read transistors to a large positive program voltage level, applying a current source to a first bit line connected to a drain of the first transistor to pull said drain of the program transistor to a first relatively small positive programming voltage level, and adjusting a second bit line voltage applied to a drain of the read transistor to a second relatively small programming voltage level.

17. The nonvolatile memory device of claim 16 wherein the voltage controller is further configured to the nonvolatile memory device by:

adjusting said word line voltage to the moderate positive read voltage level;

adjusting the second bit line voltage to the a relatively small positive read voltage level; and adjusting the source line voltage and the first bit line voltage to a substrate biasing level.

18. The nonvolatile memory device of claim 16 wherein the voltage controller is further configured to erase the nonvolatile memory device by adjusting, said source line voltage and the first and second bit line voltages to the substrate biasing level; and adjusting the word line voltage to the large positive erase voltage level.

19. The nonvolatile memory device of claim 16 wherein the moderate positive program voltage level has a voltage level equal to the voltage level of a power supply voltage source.

20. The nonvolatile memory device of claim 16 the large positive program voltage level has a voltage range of from approximately +10.0 to approximately 13.0 v.

21. The nonvolatile memory device of claim 16 wherein the substrate biasing level is approximately a ground reference voltage level.

22. The nonvolatile memory device of claim 16 wherein the first and second relatively small programming voltage levels each have a voltage level of approximately +0.6 v.

23. The nonvolatile memory device of claim 16 wherein a program time is an elapsed time at which the negative program voltage is applied to the drain of the program transistor and is approximately 40 μsec.

24. The nonvolatile memory device of claim 17 wherein the moderate read voltage level is approximately +5.0 v.

25. The nonvolatile memory device of claim 17 wherein the substrate biasing level is approximately a ground reference voltage level.

26. The nonvolatile memory device of claim 17 wherein the relatively small positive read voltage level is approximately +0.6 v.

27. The nonvolatile memory device of claim 17 wherein a read time is an elapsed time at which the small positive read voltage is applied to the drain of the read transistor and is approximately 20 μsec.

28. The nonvolatile memory device of claim 18 wherein the large positive erase voltage level has a voltage range of from approximately +10.0 v to approximately +13.0 v.

29. The nonvolatile memory device of claim 18 wherein the substrate biasing level is approximately a ground reference voltage level.

30. The nonvolatile memory device of claim 18 wherein an erase time is an elapsed time at which the large positive erase voltage level is applied to the control gates of the program and read transistors and is approximately 10 msec.

31. A nonvolatile memory device comprising:

an array of nonvolatile memory cells arranged in rows and columns with each memory cell of each row connected to a word line and a source select line, and each memory cell of each column connected to a first bit line and a second bit line, each memory cell comprising:

a program transistor having a control gate connected to the word line receive a word line voltage, a drain connected the first bit line to receive a first bit line voltage, a source connected the source select line to receive a source line voltage, and a floating gate onto which an electronic charge is placed representing a data bit stored within said nonvolatile memory device, a read transistor having a control gate connected to the word line receive the word line voltage, a drain connected to the second bit line to receive a second bit line voltage, a source connected to the source select line to receive the source line voltage, and a floating gate from which the electronic charge is sensed to determine the data bit stored within said nonvolatile memory device, and a floating gate connector joining the floating gate of the read transistor to the floating gate of the read transistor such that the electronic charge representing the data bit is present on the floating gate of the read transistor and the floating gate of a second transistor;

a voltage controller connected to the program and read transistors to regulate the word line voltage, the first bit line voltage, the second bit line voltage, and the source line voltage to control operation of said nonvolatile memory device, said voltage controller further configured to:

program said nonvolatile memory device to transfer said electronic charge to said floating gates by:

adjusting the word line voltage applied to control gates of said program and read transistors to a moderate positive programming voltage, adjusting the source line voltage applied to sources of said program and read transistors to a large positive program voltage level, applying a current source to a first bit line connected to a drain of the first transistor to pull said drain of the program transistor to a first relatively small positive programming voltage level, and adjusting a second bit line voltage applied to a drain of the read transistor to a second relatively small programming voltage level.

32. The nonvolatile memory device of claim 31 wherein the voltage controller is further configured to read the nonvolatile memory device by:

adjusting said word line voltage to the moderate positive read voltage level;

adjusting the second bit line voltage to the a relatively small positive read voltage level; and adjusting the source line voltage and the first bit line voltage to the substrate biasing level.

33. The nonvolatile memory device of claim 31 wherein the voltage controller is further configured to erase the nonvolatile memory device by:
   adjusting, said source line voltage and the first and second bit line voltages to the substrate biasing level; and
   adjusting the word line voltage to the large positive erase voltage level.

34. The nonvolatile memory device of claim 31 wherein the moderate positive program voltage level has a voltage level equal to the voltage level of a power supply voltage source.

35. The nonvolatile memory device of claim 31 the large positive program voltage level has a voltage range of from approximately +10.0 v to approximately 13.0 v.

36. The nonvolatile memory device of claim 31 wherein the substrate biasing level is approximately a ground reference voltage level.

37. The nonvolatile memory device of claim 31 wherein the first and relatively small programming voltage levels each have a voltage level of approximately +0.6 v.

38. The nonvolatile memory device of claim 31 wherein a program time is an elapsed time at which the negative program voltage is applied to the drain of the program transistor and is approximately 40 μsec.

39. The nonvolatile memory device of claim 32 wherein the moderate read voltage level is approximately +5.0 v.

40. The nonvolatile memory device of claim 32 wherein the substrate biasing level is approximately a ground reference voltage level.

41. The nonvolatile memory device of claim 32 wherein the relatively small positive read voltage level is approximately +0.6 v.

42. The nonvolatile memory device of claim 32 wherein a read time is an elapsed time at which the small positive read voltage is applied to the drain of the read transistor and is approximately 20 μsec.

43. The nonvolatile memory device of claim 33 wherein the large positive erase voltage level has a voltage range of from approximately +10.0 v to approximately +13.0 v.

44. The nonvolatile memory device of claim 33 wherein the substrate biasing level is approximately a ground reference voltage level.

45. The nonvolatile memory device of claim 33 wherein an erase time is an elapsed time at which the large positive erase voltage level is applied to the control gates of the program and read transistors and is approximately 10 msec.

46. A method of operation of a nonvolatile memory device including a program transistor and a read transistor having connected floating gates formed within a substrate, said method comprising:
   programming said nonvolatile memory device to transfer said electronic charge to said floating gates by:
   adjusting a word line voltage applied to control gates of said program and read transistors to a first moderate positive programming voltage,
   adjusting a source line voltage applied to sources of said program and read transistors to a large positive program voltage level, and
   applying a current source to a first bit line connected to a drain of the program transistor to pull said drain of the program transistor to a first relatively small positive programming voltage level and adjusting a second bit line voltage applied to a drain of the read transistor to a moderate positive programming voltage level during a first program time; and
   adjusting a voltage bit line voltage applied to a drain of the program transistor to the moderate positive programming voltage level and applying a current source to a second bit line connected to a drain of the read transistor to pull said drain of the read transistor to a second relatively small positive programming voltage level during a first program time.

47. The method of claim 46 further comprising: reading the nonvolatile memory device by:
   adjusting said word line voltage to the moderate positive read voltage level;
   adjusting the first and second bit line voltages to the a relatively small positive read voltage level; and
   adjusting the source line voltage and the first bit line voltage to the substrate biasing level.

48. The method of claim 46 further comprising erasing the nonvolatile memory device by
   adjusting, said source line voltage and the first and second bit line voltages to the substrate biasing level; and
   adjusting the word line voltage to the large positive erase voltage level.

49. The method of claim 46 wherein the moderate positive program voltage level has a voltage level equal to the voltage level of a power supply voltage source.

50. The method of claim 46 wherein the large positive program voltage level has a voltage range of from approximately +10.0 v to approximately 13.0 v.

51. The method of claim 46 wherein the first and second relatively small positive programming voltage levels are approximately ≤0.6 v.

52. The method of claim 47 wherein the moderate read voltage level is approximately +5.0 v.

53. The method of claim 47 wherein the substrate biasing level is approximately a ground reference voltage level.

54. The method of claim 47 wherein the relatively small positive read voltage is approximately +0.6 v.

55. The method of claim 47 wherein the read time is an elapsed time at which the small positive read voltage is applied to the drain of the read transistor and is approximately 20 μsec.

56. The method of claim 48 wherein the large positive program voltage level has a voltage range of from approximately +10.0 v to approximately 13.0 v.

57. The method of claim 48 wherein the substrate biasing level is approximately a ground reference voltage level.

58. The method of claim 48 wherein an erase time is an elapsed time at which the large positive erase voltage level is applied to the control gates of the program and read transistors and is approximately 10msec.

59. A nonvolatile memory device comprising:
   a program transistor having a control gate connected to selectively receive a word line voltage, a drain connected to receive a first bit line voltage, a source connected to receive a source line voltage, and a floating gate onto which an electronic charge is placed representing a data bit stored within said nonvolatile memory device;
   a read transistor having a control gate connected to selectively receive the word line voltage, a drain connected to receive a second bit line voltage, a source connected to receive the source line voltage, and a floating gate from which the electronic charge is sensed to determine the data bit stored within said nonvolatile memory device;
   a floating gate connector joining the floating gate of the read transistor to the floating gate of the read transistor such that the electronic charge representing the data bit is present on the floating gate of the read transistor and the floating gate of a second transistor;

a voltage controller connected to the program and read
transistors to regulate the word line voltage, the first bit
line voltage, the second bit line voltage, and the source
line voltage to control operation of said nonvolatile
memory device, said voltage controller configured to:
program said nonvolatile memory device to transfer said
electronic charge to said floating gates by:
adjusting a word line voltage applied to control gates of
said program and read transistors to a moderate positive
programming voltage,
adjusting a source line voltage applied to sources of said
program and read transistors to a large positive program voltage level,
applying a current source to a first bit line connected to a
drain of the program transistor to pull said drain of the
program transistor to a first relatively small positive
programming voltage level and adjusting a second bit
line voltage applied to a drain of the read transistor to
a moderate positive programming voltage level during
a first program time; and
adjusting a voltage bit line voltage applied to a drain of
the program transistor to the moderate positive programming voltage level and applying a current source
to a second bit line connected to a drain of the read
transistor to pull said drain of the read transistor to a
second relatively small positive programming voltage
level during a first program time.

60. The nonvolatile memory device of claim 59 wherein the voltage controller is further configured to read the nonvolatile memory device by:
adjusting said word line voltage to the moderate positive read voltage level;
adjusting the second bit line voltage to the a relatively small positive read voltage level; and
adjusting the source line voltage and the first bit line voltage to the substrate biasing level.

61. The nonvolatile memory device of claim 59 wherein the voltage controller is further configured to erase the nonvolatile memory device by
adjusting, said source line voltage and the first and second bit line voltages to the substrate biasing level; and
adjusting the word line voltage to the large positive erase voltage level.

62. The nonvolatile memory device of claim 59 wherein the moderate positive program voltage level has a voltage level equal to the voltage level of a power supply voltage source.

63. The nonvolatile memory device of claim 59 wherein the large positive program voltage level has a voltage range of from approximately +10.0 v. to approximately 13.0 v.

64. The nonvolatile memory device of claim 59 wherein the first and second relatively small positive program voltage levels are +0.6 v.

65. The nonvolatile memory device of claim 60 wherein the moderate read voltage level is approximately +5.0 v.

66. The nonvolatile memory device of claim 60 wherein the substrate biasing level is approximately a ground reference voltage level.

67. The nonvolatile memory device of claim 60 wherein the relatively small positive voltage is approximately +1.0 v.

68. The nonvolatile memory device of claim 60 wherein the read time is an elapsed time at which the small positive read voltage is applied to the drain of the read transistor and is approximately 20 µsec.

69. The nonvolatile memory device of claim 61 wherein large positive erase voltage level has a voltage range of from approximately +10.0 v. to approximately +13.0 v.

70. The nonvolatile memory device of claim 61 wherein the substrate biasing level is approximately a ground reference voltage level.

71. The nonvolatile memory device of claim 61 wherein an erase time is an elapsed time at which the large positive erase voltage level is applied to the control gates of the program and read transistors and is approximately 10 msec.

72. A nonvolatile memory device comprising:
an array of nonvolatile memory cells arranged in rows and columns with each memory cell of each row connected to a word line and a source select line, and each memory cell of each column connected to a first bit line and a second bit line, each memory cell comprising:
a program transistor having a control gate connected to the word line receive a word line voltage, a drain connected the first bit line to receive a first bit line voltage, a source connected the source select line to receive a source line voltage, and a floating gate onto which an electronic charge is placed representing a data bit stored within said nonvolatile memory device,
a read transistor having a control gate connected to the word line receive the word line voltage, a drain connected to the second bit line to receive a second bit line voltage, a source connected to the source select line to receive the source line voltage, and a floating gate from which the electronic charge is sensed to determine the data bit stored within said nonvolatile memory device, and
a floating gate connector joining the floating gate of the read transistor to the floating gate of the read transistor such that the electronic charge representing the data bit is present on the floating gate of the read transistor and the floating gate of a second transistor;
a voltage controller connected to the program and read transistors to regulate the word line voltage, the first bit line voltage, the second bit line voltage, and the source line voltage to control operation of said nonvolatile memory device, said voltage controller configured to:
programming said nonvolatile memory device to transfer said electronic charge to said floating gates by:
adjusting a word line voltage applied to control gates of said program and read transistors to a moderate positive programming voltage,
adjusting a source line voltage applied to sources of said program and read transistors to a large positive program voltage level,
applying a current source to a first bit line connected to a drain of the program transistor to pull said drain of the program transistor to a first relatively small positive programming voltage level and adjusting a second bit line voltage applied to a drain of the read transistor to a moderate positive programming voltage level during a first program time; and
adjusting a voltage bit line voltage applied to a drain of the program transistor to the moderate positive programming voltage level and applying a current source to a second bit line connected to a drain of the read transistor to pull said drain of the read transistor to a second relatively small positive programming voltage level during a first program time.

73. The nonvolatile memory device of claim 72 wherein the voltage controller further configured to read the nonvolatile memory device by:
adjusting said word line voltage to the moderate positive read voltage level;
adjusting the second bit line voltage to the a relatively small positive read voltage level; and adjusting the source line voltage and the first bit line voltage to the substrate biasing level.

74. The nonvolatile memory device of claim 72 wherein the voltage controller is further configured to erase the nonvolatile memory device by adjusting, said source line voltage and the first and second bit line voltages to the substrate biasing level; and adjusting the word line voltage to the large positive erase voltage level.

75. The nonvolatile memory device of claim 72 wherein the moderate positive program voltage level has a voltage level equal to the voltage level of a power supply voltage sources.

76. The nonvolatile memory device of claim 72 wherein large positive program voltage level has a voltage range of from approximately +10.0 v to approximately 13.0 v.

77. The nonvolatile memory device of claim 72 wherein the first and second relatively small positive program voltage level is approximately +0.6 v.

78. The nonvolatile memory device of claim 73 wherein the moderate read voltage level is approximately +5.0 v.

79. The nonvolatile memory device of claim 73 wherein the substrate biasing level is approximately a ground reference voltage level.

80. The nonvolatile memory device of claim 73 wherein relatively small positive read voltage level is approximately +0.6 v.

81. The nonvolatile memory device of claim 73 wherein the read time is an elapsed time at which the small positive read voltage is applied to the drain of the read transistor and is approximately 20 μsec.

82. The nonvolatile memory device of claim 74 wherein large positive erase voltage level has a voltage range of from approximately +10.0 v to approximately +13.0 v.

83. The nonvolatile memory device of claim 74 wherein the substrate biasing level is approximately a ground reference voltage level.

84. The nonvolatile memory device of claim 74 wherein an erase time is an elapsed time at which the large positive erase voltage level is applied to the control gates of the program and read transistors and is approximately 10 msec.

* * * * *

UNITED STATES PATENT AND TRADEMARK OFFICE
CERTIFICATE OF CORRECTION

PATENT NO. : 7,038,947 B2
APPLICATION NO. : 10/858020
DATED : May 2, 2006
INVENTOR(S) : Yue-Der Chih It is certified that error appears in the above-identified patent and that said Letters Patent is hereby corrected as shown below:

Column 17, Line 24, insert -- read -- after the word "to".

Column 20, Line 28, delete " $\leftrightarrows$ ", and insert -- + --.

Signed and Sealed this

First Day of August, 2006

JON W. DUDAS
*Director of the United States Patent and Trademark Office*